United States Patent [19]

Iizuka et al.

[11] Patent Number: 5,250,465
[45] Date of Patent: Oct. 5, 1993

[54] METHOD OF MANUFACTURING SEMICONDUCTOR DEVICES

[75] Inventors: Masako Iizuka; Ryoichi Mukai; Motoo Nakano, all of Kawasaki, Japan

[73] Assignee: Fujitsu Limited, Kawasaki, Japan

[21] Appl. No.: 825,255

[22] Filed: Jan. 24, 1992

[30] Foreign Application Priority Data

Jan. 28, 1991 [JP] Japan .................. 3-008464

[51] Int. Cl.⁵ .................... H01L 21/26; H01L 21/306
[52] U.S. Cl. .................... 437/173; 437/159; 437/174
[58] Field of Search ................ 437/187–200, 437/203, 173

[56] References Cited

U.S. PATENT DOCUMENTS

| | | | |
|---|---|---|---|
| 4,826,785 | 5/1989 | McClure et al. | 437/174 |
| 4,968,643 | 11/1990 | Mukai | 437/194 |
| 4,970,176 | 11/1990 | Tracy et al. | 437/187 |
| 5,032,233 | 7/1991 | Yu et al. | 437/173 |
| 5,110,759 | 5/1992 | Mukai | 437/187 |

FOREIGN PATENT DOCUMENTS

| | | |
|---|---|---|
| 0194950 | 9/1986 | European Pat. Off. . |
| 0351001 | 1/1990 | European Pat. Off. . |
| 0353120 | 1/1990 | European Pat. Off. . |
| 0388563 | 9/1990 | European Pat. Off. . |
| 59-33850 | 2/1984 | Japan .................. 437/203 |
| 59-61146 | 4/1984 | Japan . |
| 63-37634 | 2/1988 | Japan . |
| 1-287949 | 11/1989 | Japan .................. 437/203 |

OTHER PUBLICATIONS

Patent Abstracts of Japan, vol. 12, No. 265 (E-637) 23 Jul. 1988 & JP-A-63 048841 dated Mar. 1, 1988.
W. Spiess et al., "Via hole filling with gold melting by KrF excimer laser irradiation," Journal of Vacuum Science and Technology: Part B, vol. 7, No. 1 Feb. 1989, New York, N.Y., pp. 127–128.

Primary Examiner—Robert Kunemund
Assistant Examiner—Loc Q. Trinh
Attorney, Agent, or Firm—Staas & Halsey

[57] ABSTRACT

A semiconductor device having small diameter via-holes, particularly not greater than 0.6 microns, for a multilayer interconnection is produced by a method comprising covering an interlayer film and via-holes with a continuous, first metal film by a CVD process, and heating and melting by an irradiation of an energy beam a second metal film deposited on the first film by a PVD process, together with the first metal film, to fully fill the via-holes with the material from the outside of the holes, to thus form conductive plugs therein. The deposition of the material of the second metal film and the filling of the via-holes may be simultaneously performed by a high temperature sputtering process.

14 Claims, 8 Drawing Sheets

×300

METHOD OF MANUFACTURING SEMICONDUCTOR DEVICES

BACKGROUND OF THE INVENTION

1. Field of the Invention

The invention relates to a process for manufacturing a semiconductor device, and more particularly, to a process for manufacturing a semiconductor device comprising connecting an underlying conductive layer and an overlaying conductive layer through via-holes prepared in an interlayer insulating film, or filling conductive plugs into via-holes formed in an interlayer insulating film.

2. Description of the Related Art

In semiconductor integrated circuits, a certain degree of freedom is given to bonding between elements by a multilayer interconnection, and when establishing continuity between upper and lower conductive layers, the following methods are generally used:

First, a method is used in which via-holes are formed in an interlayer insulating film covering an underlying conductive layer, a metal material such as aluminum is then deposited inside the via-holes and on the interlayer insulating film by an evaporation or sputtering process, and then the metal film is patterned to form an overlaying conductive layer. The formed overlaying layer is generally recessed at the locations of the via-holes.

Second, a method has been proposed in which a conductive plug is filled into a via-hole in an interlayer insulating film, and an overlaying conductive layer in contact with the conductive plug is formed on the interlayer insulating film. According to this method, the conductive layer located on the via-holes can be planarized to thereby locate different via-holes thereon, and thus a degree of freedom of the wiring design can be further increased.

With a high integration of semiconductor devices, the sizes of via-holes have been reduced and aspect ratios increased. Accordingly, when the metal film used for the overlaying conductive layer and the conductive plug is formed by a sputtering or evaporation process, it is hard to deposit the metal material on the inside wall of the via-holes, due to the shadow effect, and thus the metal film is discontinuous within the holes. Consequently, the step coverage may be unsatisfactory, whereby the contact resistance between the conductive plug and the underlying conductive layer is increased, and in the worst case, disconnections may occur in the via-holes. The via-hole size able to be successfully filled by such a prior method, with a metal, is as large as 1 micrometer for an aluminum material To solve these problems, a method has been proposed in which the metal film is deposited and is formed in the via-holes in the continuous state, by a CVD process free of the shadow effect, to thus improve the coverage, or a method in which the metal film formed on the insulating film and the inside wall of the via-holes is melted by an irradiation by a pulse laser, and the molten metal film is transported as a mass into the via-holes. (The latter method is described in JP-A-37634/63, laid-open on Feb. 18, 1988.)

According to the former method, however, since an organometallic compound gas is generally used for a metal film deposition of, for example, aluminum, problems arise such as where carbons contained in the depositing gas, is included in the metal film, the resistivity of the upper conductive layer and the conductive plug increases. Therefore, the method of using a chemical vapor deposition (CVD) process for the deposition of metal material is now little utilized.

In the latter method, in a state in which the metal film becomes discontinuous in the via-holes, because the molten metal film has a low wetting property to the interlayer insulating film, disadvantages arise such as a mass transportation of the metal film melted by the pulse laser irradiation to the top or bottom of the via-holes, producing voids therein JP-A-61146/59, laid-open on Apr. 7, 1984, discloses a method comprising forming a first conductive film on an insulating film and portions whereat contact holes are preformed, the conductive film consisting of a metal or metal silicide having a high melting point formed by a vapor deposition process, coating the first conductive film with a second conductive film consisting of a metal having a low melting point, and melting the second conductor film.

In the method disclosed in JP-A-61146/59, the second conductive film having a lower melting point is only fused, and the first conductor film having a higher melting point is left in a solid state. Further, the melting of the second film with a lower melting point is effected by merely heating the second film together with both of the other layers or films and the substrate, for a very long time, so that the entire article to be processed is brought to an elevated temperature at which the second film is fully melted.

In the prior art mentioned above, the difficulty of making a second film continuous is not considered. (The prior art is based on the premise that a sputter process gives a continuous film.) To obtain a fully filled conductive plug in a small via-hole, a film to be melted must be continuous, as mentioned above.

SUMMARY OF THE INVENTION

An object of the invention is to provide a method of manufacturing a semiconductor device, which method can not only reduce a contact resistance between multiple conductive layers but also fully fill via-holes having a small opening size, e.g., not greater than 0.6 micrometers, with a metal material, to thus planarize the top thereof.

It has been found that the above object is accomplished by covering a top surface of an interlayer insulating film and inside wall and bottom surfaces of via-holes with a continuous metal film, then providing another metal film thereon, which may be discontinuous, and thereafter, melting both films by an appropriate heating means to thereby fully fill the metal material in the via-holes.

In one aspect thereof, the present invention provides a method of manufacturing a semiconductor device having a conductive layer connected by conductive plugs formed in via-holes, comprising forming via-holes in an interlayer insulating film provided on an underlaying conductive layer, depositing a first metal film continuously along the top surface of the interlayer insulating film and the inside of the via-holes by a chemical vapor deposition (CVD) process, depositing a second metal film on the first metal film by a physical vapor deposition (PVD) process, and melting the first and the second metal films to form conductive plugs in via-holes by an irradiation of an energy beam, to thereby fill the via-holes with the metal material from the outside thereof.

In another aspect thereof, the present invention provides a method of manufacturing a semiconductor device having a conductive layer connected by conductive plugs formed in via-holes, comprising forming via-holes in an interlayer insulating film provided on an underlying conductive layer, depositing a first metal film continuously along the top surface of the interlayer insulating film and the inside of the via-holes by a CVD process, depositing a second metal film on the first metal film by a PVD process, patterning the second metal film to leave a part thereof inside and around the via-holes, melting the first metal film and the second metal film left behind by an irradiation of an energy beam, to thereby cause the metal material from the outside of the via-hole to form a conductive plug therein, and forming a conductive layer on the interlayer insulating film and the plugs.

The above methods both involve irradiation by an energy beam, to thereby heat and melt the first and the second metal films and cause the material thereof to be mass-transported into the via-holes. In another aspect thereof, the present invention uses the heat of a high temperature sputtering step, by which a second metal film is deposited, and the first metal film and the second metal film are melted to fill the via-holes with the material from the outside thereof.

Thus, the invention also provides a method of manufacturing a semiconductor device having a conductive layer connected by conductive plugs formed in via-holes, comprising forming via-holes in an interlayer insulating film provided on an underlying conductive layer, depositing a first metal film continuously along the top surface of the interlayer insulating film and the inside of the via-holes by a CVD process, and depositing a second metal film on the first metal film by a high temperature sputtering process, to increase the surface temperature of the deposited metal film by an ion-bombardment due to a plasma during the deposition, and thus melt the metal materials of the first and the second films to form conductive plugs in the via-holes to thereby fill the via-holes with the metal material from the outside thereof.

Preferably, the thickness of the first metal film is less than that of the second metal film.

BRIEF DESCRIPTION OF THE DRAWINGS

The above and other objects and advantages of the present invention will be more fully understood from the following detailed description given with reference to the accompanied drawings, in which.

DESCRIPTION OF THE PREFERRED EMBODIMENTS

Figure 1A:
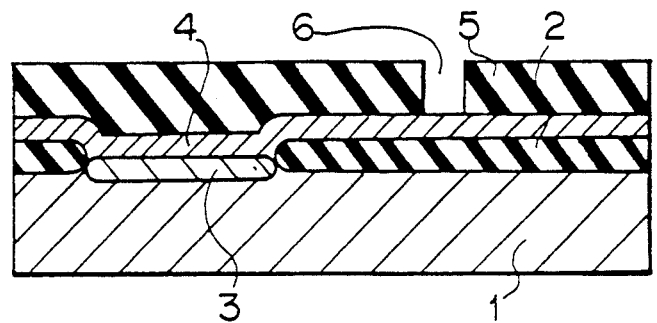
FIGS. 1A to 1D are sectional views showing the steps for producing a semiconductor device according to an embodiment of the method of the present invention.

A wettability of a molten metal, such as aluminum, relatively, to an interlayer insulating film, such as one made of silicon oxide, is generally insufficient to allow the molten metal to flow into a via-hole having a small opening size no greater than, for example, 0.6 micrometers, to fully fill the hole, but once a continuous film of a metal is formed on the surface of the interlayer film, and especially on the wall surfaces of the via-hole, the metal material outside the hole will be easily mass-transported or flow into and fully fill the hole. Consequently, in the present invention, a continuous film of a metal material is provided, as a first film, on the interlayer insulating film surface and the wall surfaces of the hole.

A CVD process can essentially provide a continuous deposited film on the side walls of the via-hole as well as on the surface of the interlayer film, even if the via-hole opening size is as small as that in which a conventional PVD process, such as evaporation or sputtering, cannot provide such a continuous film.

Thus, the CVD process is advantageously employed in the present invention to provide both the surface of the interlayer film and the side walls of the hole with a continuous film of metal material Nevertheless, the film deposited by a CVD process usually contains more or less carbon resulting from a reaction gas used in the process. For example, for the deposition of an aluminum film by a CVD process, a reaction gas containing carbon, such as dimethyl aluminum hydride, is conventionally used, and this causes a significant amount of carbon to be deposited together with the aluminum, and thus substantially increases the resistivity of the deposited film or layer. Therefore, the thickness of the film deposited by the CVD process cannot be increased without limit, but on the other hand, the film deposited by the CVD should have a minimum thickness. The film thickness therefore must fall within a reasonable range.

For example, an aluminum film deposited on a oxide film by a CVD process should be at least 20 nanometers, to ensure continuity and stability thereof. The acceptable upper limit of the aluminum film is that over which the film resistivity, increased due to the inclusion of carbon, will have an adverse effect on an object device, and thus the upper limit varies depending on a designed product device. Further, the film thickness is generally dependent on the CVD conditions, such as temperature and pressure, and an underlayer film. Note, it is sufficient for the first metal film to have a thickness ensuring a provision of a continuous film on the interlayer insulating film, and the first film should not have an excess thickness able to exert an adverse effect on the device.

For a metal material, aluminum is preferably used as a first film and a second film, but it is possible to use copper as a first film, and aluminum as a second film. Namely, a metal metal material of a first film may be the same as that of a second film, or they may be different from each other.

Once the continuous film is provided on the interlayer film surface and via-hole surfaces formed therein, a second metal film may be formed on the continuous film by a PVD process. In the case of the via-holes having a smaller opening, particularly smaller than 0.6 micrometers, a PVD process generally fails to provide the via-hole wall surfaces with the deposited material, and which instead will deposit only on the interlayer film and the via-hole bottom surfaces, leaving the wall surfaces of the hole uncovered.

Therefore, although the continuous film provided b the CVD process permits the filling of the via-hole by the metal material outside the hole, the material must be successfully mass-transported to and flow into the hole, to satisfactorily achieve this filling. The material to be mass-transported may be given the necessary energy by a heating means.

In an embodiment of the invention, the material to be mass-transported may be heated by irradiation same by of an energy beam, such as a pulse laser beam. The pulse laser beam is particularly useful for moderately heating the materials deposited by a CVD and PVD processes thereby, to melt the materials and allow them to flow into the hole, because this beam makes it possible to control the heating time within a short period required only for melting the material to be mass-transported into the hole. For example, using an excimer pulse laser, e.g., generated from ArF or XeCl, the energy necessary to fill the via-hole with the material from outside of the hole is supplied within a very short time, e.g., an order of 10 to 30 nanoseconds, by only one emission, and thus excess heating is avoided. The energy is provided only to the first and second metal films to be melted, as the energy emitted by the laser unit is conveniently controlled, and consequently, the time during which the materials are in a molten state is very short, and thus heating of the underlayers and substrate thereof is not induced. Use of a conventional heating means, such as a heating furnace, is undesirable, as it usually takes a much longer time for heating, e.g., ten or more minutes, and brings the whole device to be processed to an elevated temperature, causing the detrimental phenomenon known as a ballup of the second metal material.

Any metal, such as aluminum, titanium and copper, may be used as the second film metal, and be made to flow into the via-hole by the pulse laser heating. Aluminum has a very high reflectivity compared to other metals, and thus it may be necessary to provide a thin film of a material other than aluminum on the second metal film, to enhance the absorption of the laser light and promote the conversion thereof to thermal energy, if aluminum is used as the second film material. Titanium or copper is advantageously employed as the light absorbing film on the aluminum film. The absorbing film should not have an excess thickness, and a thickness of the order of 10 nanometers is usually sufficient for the absorbing film. Silicon may be used for the light absorbing film.

When a pulse laser is thereon, the materials of the first and second metal films are momentarily melted, and since the continuous film has been formed on the side wall of the via-hole, the molten material from the outside of the hole readily flows into and fully fills the hole. The material remaining outside the hole forms a planarized overlaying conductive layer on the interlayer insulating film and the conductive plugs.

The second metal film may be patterned prior to the irradiation of pulse laser, to thereby leave part of the metal material only around and inside of the via-holes. The material thus left behind can be fully filled in the via-holes by means of the pulse laser irradiation. In this case, the volume of the metal material left behind must be larger than the space the material is to fill and form the conductive plug therein. Once the conductive plugs are made, the overlaying conductive layer having a planar surface may be formed on both the interlayer insulating film surface and the plugs, by any conventional PVD process such as evaporation or sputtering.

In a further embodiment, the invention can replace the deposition by a PVD process plus the pulse laser irradiation of the second metal film, with a high temperature sputter process. In this case, the surface temperature of the deposited metal film may be increased by ion-bombardment due to a plasma, while the metal is deposited. The depositing material of the second metal film may be thus melted or softened together with the material of the first film and thereby mass-transported into the via-holes, resulting in a filling of the via-holes to form the conductive plugs. The simultaneous formation of the conductive plugs and the second metal film with a planar surface eliminates the laser irradiation of the second film preliminarily deposited by the PVD, to thus simplify the process.

The time required by a high temperature sputtering of a metal film on an interlayer insulating film is usually no longer than one minute, and therefore, an undesirable interreaction of the materials of the first metal film and the underlying layer may be negligible, if any. In contrast, such an interreaction causing an increased resistivity and contact resistance, detrimental to the successful interconnection of the upper and lower layers, can take place if a heating means requiring a much longer time, such as a heating in a furnace, is used.

The following examples are provided so that those skilled in the art can better understand and appreciate the invention. These examples are for purposes of illustration only and are not to be construed as limitations of the scope of the invention as presented herein.

EXAMPLE 1

This example is described with reference to FIG. 1. In the drawing, a p-type semiconductor substrate of silicon is illustrated by reference symbol 1. In an area of the substrate 1 for forming an element surrounded by a selective oxidized film 2 to be separated from other elements, not shown, an $n^+$-type diffused layer 3 was formed for a source/drain of an MOS transistor. On the selective oxidized film 2, a first conductive layer 4 passing over and onto the $n^+$-type diffused layer 3 was formed, the layer 4 being made of polycrystalline silicon doped with an impurity, and covered by an interlayer insulating film 5 having a thickness of about 1 micrometer.

The interlayer insulating film 5 lying in the element separating area was patterned by a photolithography method, to open a via-hole 6 having a diameter of 0.5 micrometers over the layer 4 (FIG. 1A). (All of the following examples used a similar substrate provided with a via-hole 0.5 μm in diameter.)

Figure 1B:
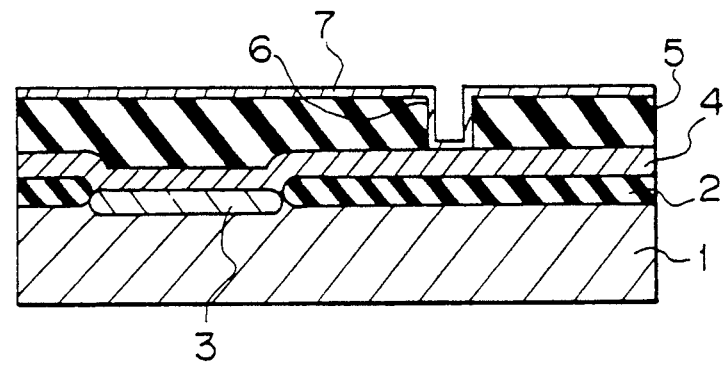

A first aluminum film 7 was then formed continuously along the top surface of the interlayer insulating film 5 and the inside of the hole 6 by a CVD process, the formed film having a thickness of 0.05 micrometers (FIG. 1B). In the CVD process, the substrate was heated to 240° C., and dimethyl aluminum hydride (DMAH), $AlH(CH_3)_2$, was used as an reacting gas. A reacting gas other than DMAH may be used, such as trimethyl aluminum (TMA) or triisobutyl aluminum (TIBA).

Figure 1C:
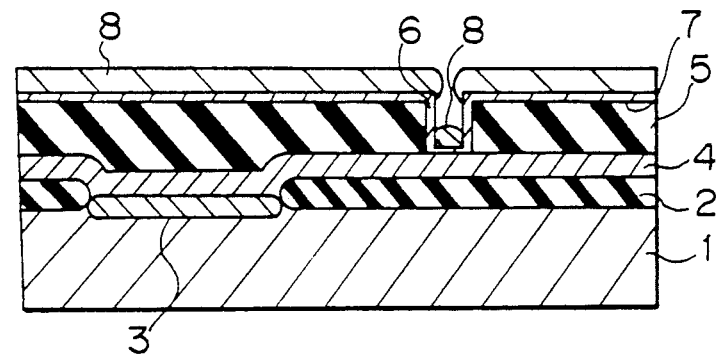

A second aluminum film 8 with a thickness of 0.5 micrometers was then deposited by a sputter process. The deposited film 8 had a uniform thickness on the interlayer insulating film 5, but the deposition on the inside wall surface of the via-hole 6 was extremely small due to the shadow effect (FIG. 1C).

Figure 1D:
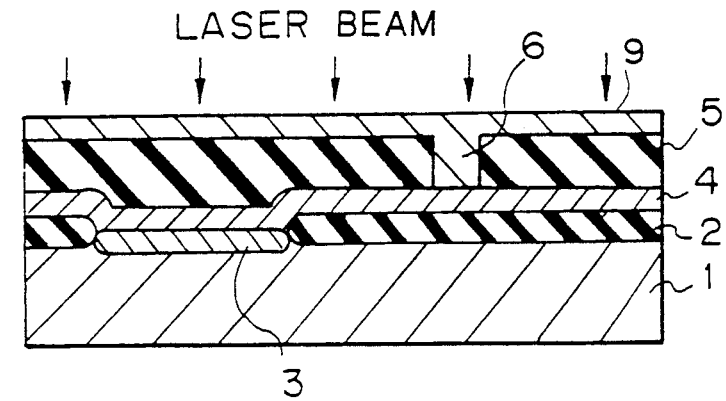

Using an XeCl excimer laser unit, a pulse laser beam having an energy density of 5 J/cm$^2$ per pulse of 25 nanoseconds was irradiated thereon to melt the aluminum films 7 and 8 and, the material outside of the via-hole then readily flowed into the via-hole 6, due to the presence of the continuous film 7 on the side wall of the hole thereby, to fully fill the inside of the hole (FIG. 1D). The resulting film consolidating the first and second aluminum films 7 and 8 was then patterned by photolithography to form the second conductive layer 9.

The via-hole 6 thus processed was fully filled with aluminum, was free of voids, and was securely connected to the upper and lower layers. Further, since the aluminum had been melted by the moderate pulse laser heating, the upper conductive layer 9 formed on the via-hole 6 was planarized at the same level as that of the planar surface created on the interlayer insulating film 5, whereby, a different via-hole can be formed directly on the via-hole 6. The first aluminum film formed by the CVD process was very thin, and thus the carbon content in the first film was extremely small, and the resistivity of the layer 9 on the interlayer insulating film 5 and the contact resistance was not increased to an extent such that it had an adverse effect on the designed device.

EXAMPLE 2

The procedure of Example 1 was repeated, except that a titanium film for absorbing irradiated laser beam was provided on the second aluminum film. The titanium film had a thickness of 0.01 micrometers.

An irradiation of an XeCl excimer laser having an energy density of 2 J/cm$^2$ per pulse of 25 nanoseconds successfully filled the via-hole 6 with aluminum and provided a planar, upper conductive layer 9 on both the interlayer insulating film 5 and the via-hole 6, as in Example 1. The plug formed in the hole 6 as well as the overlaying layer 9 formed on the interlayer film 5 displayed satisfactory properties similar to those obtained in Example 1.

EXAMPLE 3

This example illustrates a formation of a conductive plug by filling a via-hole with aluminum, followed by a formation of an overlaying conductive layer of aluminum.

A first thin aluminum film 7 was formed uniformly over the top surface of an interlayer insulating film 5 and the inside wall and bottom surfaces of a via-hole 6 by a CVD process, as shown in FIG. 1B, and a second aluminum film 8 was then thickly deposited thereover by a sputtering process, as shown in FIG. 1C. The first film had a thickness of 0.05 micrometers, and the second film thickness was 0.15 micrometers. The second aluminum film 8 was not continuously formed at the inside wall surface of the hole 6 due to the shadow effect.

Figure 2A:
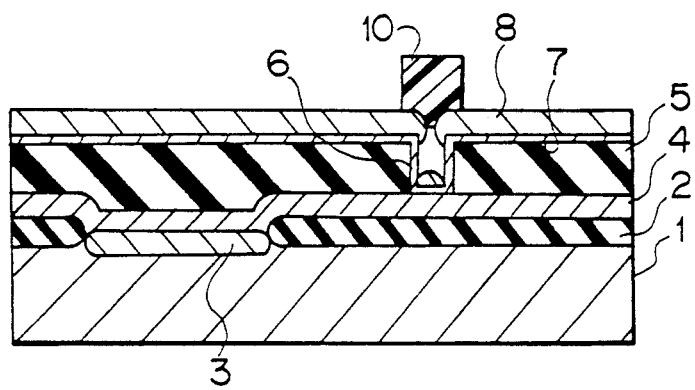
FIGS. 2A to 2D are sectional views showing the steps according to another embodiment of the present invention.
Figure 2B:
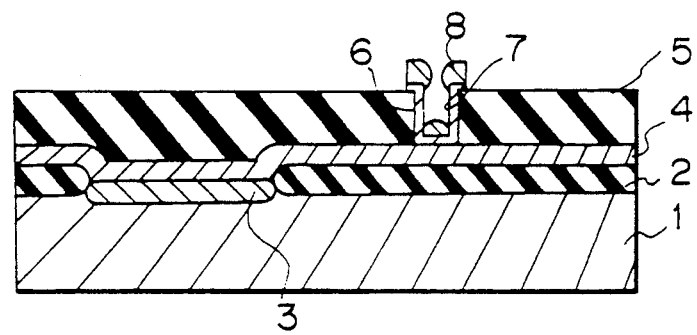

The area located over and around the via-hole 6 was covered by a resist pattern 10, as shown in FIG. 2A. The aluminum films 7 and 8 in the area not covered by the resist pattern 10 were removed by a reactive ion etching, and the pattern 10 was then removed, as indicated in FIG. 2B. The size of the resist pattern 10 was 0.9×0.9 micrometers.

Figure 2C:
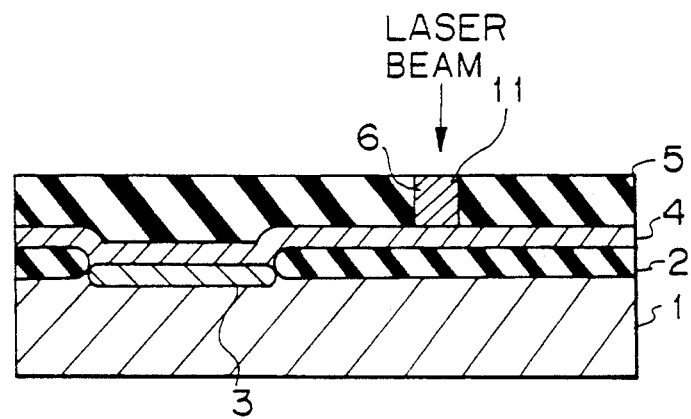

An XeCl excimer laser beam having a pulse energy density of 1 J/cm$^2$ was irradiated to melt the aluminum film 8 remaining in and around the hole 6, together with the underlying aluminum film 7, the molten aluminum from the outside of the hole flowing into the hole 6, to thus fully fill the inside of the hole as shown in FIG. 2C. The aluminum in the via-hole formed a conductive plug 11.

Figure 2D:
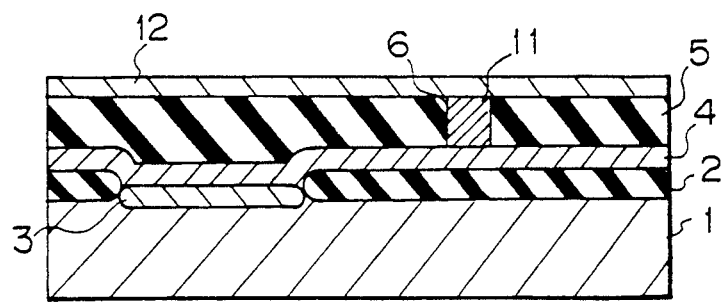

Another layer of aluminum was then deposited on the interlayer insulating film 5 and the conductive plug 11 by a sputtering process, and the deposited layer was patterned to form an upper conductive layer 12, as shown in FIG. 2D. The formed conductive layer was connected to the first conductive layer 4 through the conductive plug 11 formed in the via-hole 6.

Using these steps, the via-hole 6 was fully filled with aluminum, as in Example 1, whereby the upper conductive layer 12 was planarly formed. Moreover, since the first aluminum was thin, the conductive plug 11 had a very small carbon content, and the contact resistance was not increased.

In this example, although two metal films 7 and 8 were patterned to leave only the required amount of metal to be mass-transported into and fill the hole 6, the upper metal film 8 only may be selectively patterned.

EXAMPLE 4

This example illustrates the use of different metals for the first and second metal films.

Figure 3A:
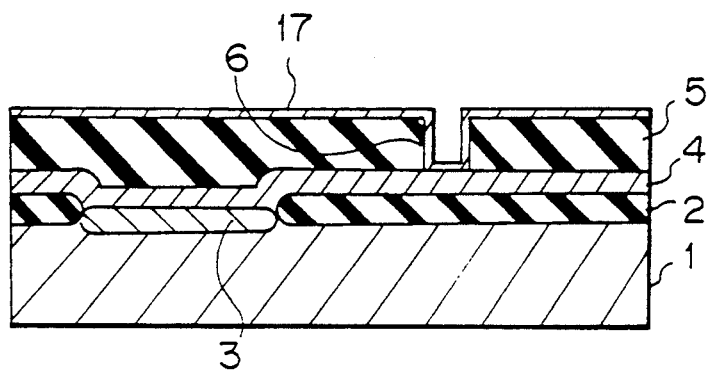
FIGS. 3A to 3C are sectional views showing the steps according to still another embodiment of the present invention.

A continuous copper film 17 having a thickness of 0.05 micrometers was deposited on the top surface of an insulating film 5 and the inside wall and bottom surfaces of a via-hole 6 by a CVD process, as shown in FIG. 3A. The reaction gas used was a copper complex, $Cu(hfa)_2$. The temperature of the substrate 1 was about 240° C.

Figure 3B:
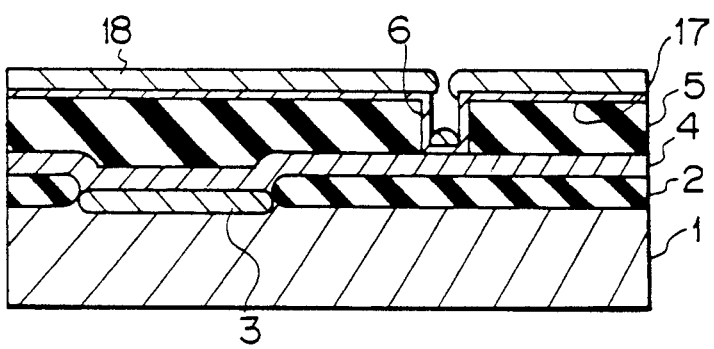

An aluminum film 18, as a second metal film, was deposited on the copper film 17 by a sputtering process, to a thickness of 0.15 microns, as shown in FIG. 3B. Very little of the side wall area of the via-hole 6 was covered by the aluminum film, due to the shadow effect.

Figure 3C:
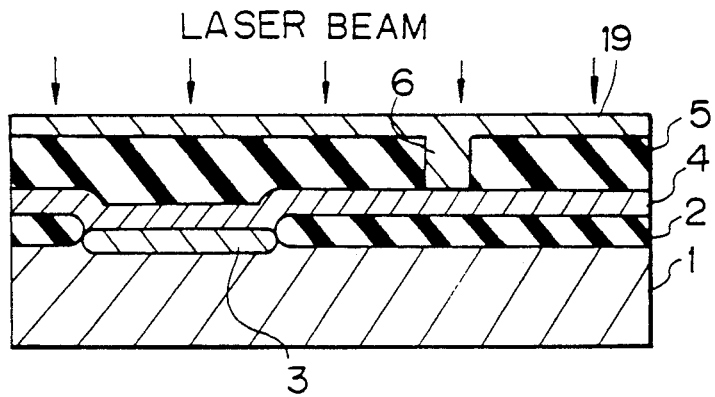

An XeCl laser beam having an energy density of 5 J/cm$^2$ per pulse of 25 nanoseconds was irradiated to melt the aluminum film 18 and the copper film 17. The molten aluminum material successfully flowed into the via-hole 6. The via-hole 6 was thus fully filled with the metal material, as indicated in FIG. 3C. The resultant film consolidating the aluminum and copper films 18 and 17 were then patterned to form an overlaying wiring layer 19.

In this case, the conductive film 19 was planarly formed on the interlayer insulating film 5, and the conductive film 19 was connected to an underlying conductive layer 4 through the conductive plug formed in the via-hole 6. The copper film did not cause an increased resistivity in the conductive layer 19 or an increased contact resistance of the conductive plug, because the carbon contents of the conductive layer 19 and the conductive plug were very low, since the copper film was very thin, even if the copper film contained carbon.

The overlaying conductive layer 19 may be, of course, formed by following a formation of a conductive plug, in a similar manner to that described in Example 3. The via-hole 6 will be fully and more planarly filled with aluminum, and thus the formed plug does not cause a cave-in of a conductive layer formed thereon.

EXAMPLE 5

This example illustrates the use of a high temperature sputtering to simultaneously effect a deposition of the second metal film and filling of a via-hole with the metal material.

Figure 4A:
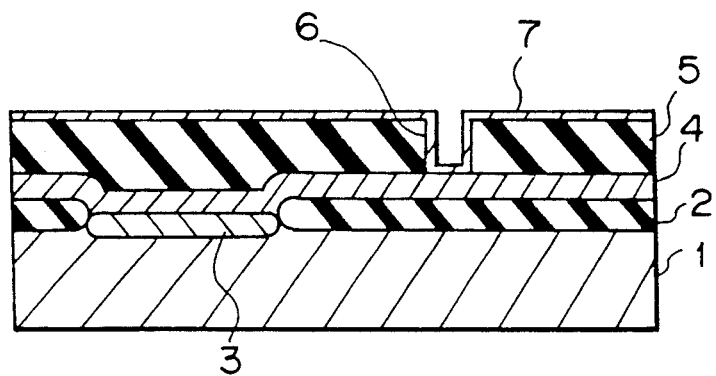
FIGS. 4A and 4B are sectional views showing the steps according to a further embodiment of the invention.
Figure 4B:
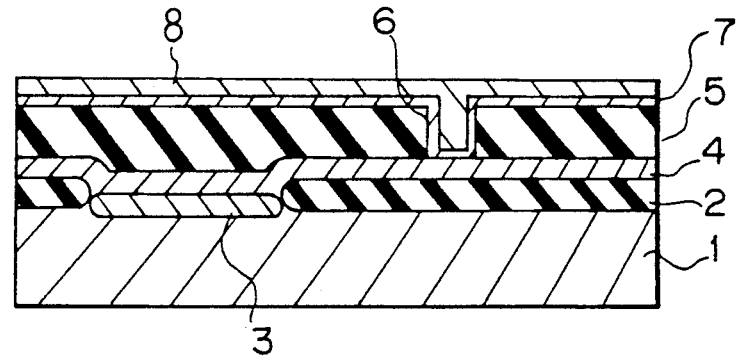

A first, thin aluminum film 7 was deposited on the top surface of an interlayer insulating film 5 and the inside of a via hole 6 by a CVD process, to a thickness 0.05 micrometers, as shown in FIG. 4A. The semiconductor silicon substrate 1 was then placed in a high temperature sputtering unit, not shown in the drawing, to cause a second aluminum film 80 having a thickness of 0.5 $\mu$m to be deposited on the first aluminum film 7, as shown in FIG. 4B. The temperature of the substrate was set at about 550° C.

In the high temperature sputtering, the aluminum coming onto the first aluminum film 17 was deposited on the film in a molten state, and fully filled the inside of the via-hole 6, because an ion-bombardment due to to plasma took place in the film deposited on the surface of the first aluminum film 7, thereby raising the surface temperature thereof to about 660° C. In this case, the first film became molten due to the heat from the second film.

According to this method, not only is an irradiation by a laser beam omitted, but a grain size in the aluminum film 8 is increased to make it possible to provide countermeasures to electro-migration and so forth.

An overlaying conductive layer was then formed by patterning the resultant film consolidating the aluminum films 7 and 8.

Although the method of the present invention has been explained with reference to the drawings in which a single via-hole is indicated, it will be understood that the invention is applicable to the manufacture of devices having a number of via-holes. It will be also understood that the opening of the via-hole may have any configuration, such as a square, rectangle or circle.

Figure 5A:
FIGS. 5A and 5B show electron micrographs of a via-hole having a continuous metal film on the side wall thereof before a pulse laser irradiation and a successfully formed conductive plug after the irradiation, respectively.
Figure 5B:
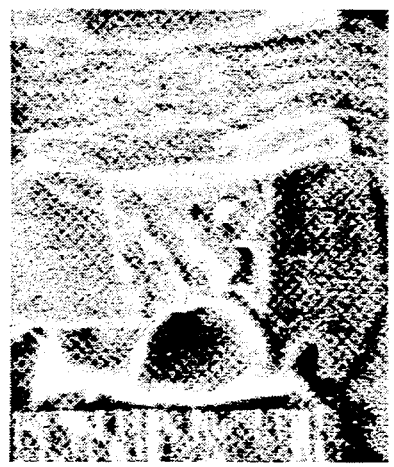

FIGS. 5A and 5B are electron micrographs showing a via-hole provided with a continuous metal film on its side wall surface before a pulse laser irradiation and a conductive plug formed in the via-hole after the laser irradiation, respectively. These figures obviously demonstrate that when a via-hole is provided with such a continuous film on its side wall surface, a metal material outside the hole can then be mass-transported and fully filled into the hole by a pulse laser irradiation, to thereby form a satisfactory conducting plug and a planar surface thereon. In this case, the via-hole had an opening size of 0.7 micrometers and a depth of 1.0 micrometer, and an XeCl examiner laser of 0.58 J/cm$^2$ was irradiated.

Figure 6A:
FIGS. 6A and 6B show electron micrographs of a via-hole having a discontinuous metal film on the side wall thereof before a laser irradiation and the hole not fully filled with a metal material and having a cavity after the irradiation, respectively.
Figure 6B:

FIGS. 6A and 6B are electron micrographs similar to those of FIGS. 5A and 5B, but the present via-hole has discontinuity of metal film on its side wall. After a pulse laser irradiation, a satisfactory conducting plug is not produced because of the formation of a cavity capped with the metal material(FIG. 6B) and thus, when a via-hole of small size has a discontinuous metal film on its side wall, a successful flow of a molten metal into the via-hole will be prevented. The hole dimensions and irradiation conditions in this case were the same as these in FIGS. 5A and 5B.

Figure 7A:
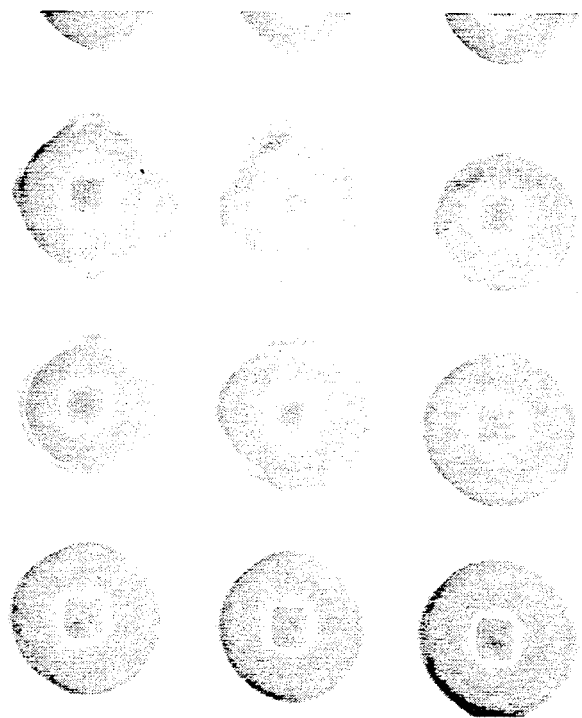
FIGS. 7A and 7B are electron micrographs of a top view of a balled up film and an enlarged cross section of a via-hole, respectively.
Figure 7B:
Figure 8:
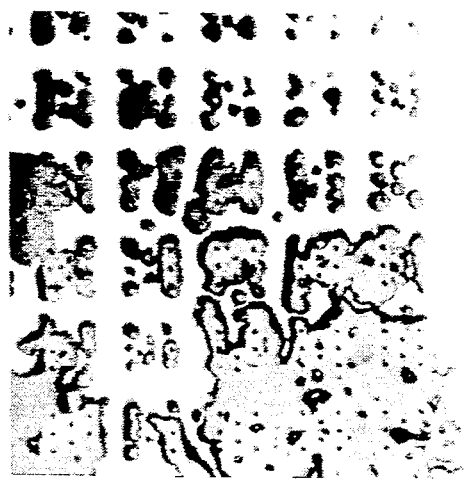
FIG. 8 shows a micrograph of a top view of a metal film suffering from an even more severe balling up phenomenon.

A balled up film is illustrated in electron micrographs of FIGS. 7A and 7B. This balled up film was formed due to an insufficient wettability of the molten metal relatively to the underlayer. In FIG. 7A, which is a top view of the film, gray circles including a square via-hole show the areas of an underlayer not covered by the metal film. FIG. 7B shows an enlarged cross section of a via-hole and its circumference. The upper film of the metal covers only the bottom surface of the hole and the area except for the hole circumference. An even more severe balled up film is shown in FIG. 8, in which a metal film indicated as the white area is locally situated.

Thus, according to the method of the invention, semiconductor devices having via-holes with an opening size of less than 1 micrometer, and even less than 0.6 micrometers, can be produced, and consequently, the invention greatly contributes to an increase of a packing density of devices.

We claim:

1. A method of manufacturing a semiconductor device having a conductive layer connected to conductive plugs formed in via-holes, the method comprising;

forming via-holes in an interlayer insulating film provided on an underlying conductive layer, the periphery of each via hole being defined by a corresponding inside wall of the interlayer insulating film;

depositing a first, continuous metal film on the top surface of the interlayer insulating film and the inside wall of each of the via-holes by a chemical vapor deposition process;

depositing a second metal film on the first metal film by a physical vapor deposition process; and melting the first and the second metal films by irradiation of same with an energy beam, thereby to cause the melted metal material of corresponding portions of the first and second metal films, deposited on the top surface of the interlayer insulating film adjacent to the periphery of each via-hole, to flow into and fill the via-hole completely and thereby form a conductive plug therein.

2. The method according to claim 1, wherein the first and second metal films are of the same material.

3. The method according to claim 2, wherein said material is aluminum.

4. The method according to claim 3, wherein a thin film for absorbing the energy beam irradiation, consisting of a material selected from the group o titanium, copper and silicon, is provided on the second film of aluminum.

5. The method according to claim 3, wherein the first film of aluminum has a thickness of at least 20 nanometers.

6. A method of manufacturing a semiconductor device having a conductive layer connected to conductive plugs formed in via-holes, the method comprising:

forming via-holes in an interlayer insulating film provided on an underlying conductive layer;

depositing a first, continuous metal film on the top surface of the interlayer insulating film and the inside wall of each of the via-holes by a chemical vapor deposition process;

depositing a second metal film on the first metal film by a physical vapor deposition process;

patterning the second metal film such that corresponding portions thereof remain within the via-hole and on the top surface of the interlayer insulating film adjacent to the periphery of each via-hole;

melting the first metal film and the remaining portions of the second metal film by irradiation of same with an energy beam, thereby to cause the melted metal material of the remaining portions of the second metal film and the corresponding portions of the first metal film adjacent the periphery of each via-hole, to flow into and fill each such corresponding via-hole completely and thereby to form a conductive plug therein having an exposed top surface in a substantially common plane with the top surface of the interlayer insulating film; and forming a conductive layer on the exposed top surface of the interlayer insulating film and each plug.

7. The method according to claim 6, wherein the first and second metal films are of the same material.

8. The method according to claim 7, wherein said material is aluminum.

9. The method according to claim 8, wherein a thin film for absorbing the energy beam irradiation, consisting of a material selected from the group of titanium, copper and silicon, is provided on the second film of aluminum.

10. The method according to claim 8, wherein the first film of aluminum has a thickness of at least 20 nanometers.

11. A method of manufacturing a semiconductor device having a conductive layer connected to conductive plugs formed in via-holes, the method comprising:

forming via-holes in an interlayer insulating film provided on an underlying conductive layer, the periphery of each via hole being defined by a corresponding inside wall of the interlayer insulating film;

depositing a first, continuous metal film on the top surface of the interlayer insulating film and the inside wall of each of the via-holes by a chemical vapor deposition process;

depositing a second metal film on the first metal film by a high temperature sputter process, the surface temperature of the deposited second metal film being increased by ion-bombardment due to the plasma during the deposition thereby melting the respective metal materials of the first and second films, the melted metal materials, at least in the corresponding portions thereof adjacent to the periphery of each via-hole, flowing into and filling each via-hole completely and thereby forming a plug therein.

12. The method according to claim 11, wherein the first and second metal films are of the same material.

13. The method according to claim 12, wherein said material is aluminum.

14. The method according to claim 13, wherein the first film of aluminum has a thickness of at least 20 nanometers.

* * * * *

UNITED STATES PATENT AND TRADEMARK OFFICE
CERTIFICATE OF CORRECTION

PATENT NO. : 5,250,465
DATED : Oct. 5, 1993
INVENTOR(S) : IIZUKA et al.

It is certified that error appears in the above-indentified patent and that said Letters Patent is hereby corrected as shown below:

Col. 1, line 66, change "carbons" to --carbon,--.

Col. 4, line 16, after "relatively" delete ",".

Col. 5, line 23, before "same" insert --of--;
line 24, delete "of";
line 26, after "processes" insert --,--;
line 27, after "thereby" delete ",".

Col. 7, line 20, change "hole thereby," to --hole, thereby--.

Col. 10, line 52, change "group o" to --group of--.

Signed and Sealed this

Twenty-sixth Day of July, 1994

Attest:

BRUCE LEHMAN

*Attesting Officer*   *Commissioner of Patents and Trademarks*